US010672328B1

(12) United States Patent
Wang et al.

(10) Patent No.: US 10,672,328 B1
(45) Date of Patent: Jun. 2, 2020

(54) LIGHT EMITTING DIODE DISPLAY APPARATUS

(71) Applicant: Au Optronics Corporation, Hsinchu (TW)

(72) Inventors: Hsien-Chun Wang, Hsinchu (TW); Ya-Jung Wang, Kaohsiung (TW); Sung-Yu Su, Tainan (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/398,270

(22) Filed: Apr. 30, 2019

(30) Foreign Application Priority Data

Feb. 26, 2019 (TW) .............................. 108106493 A

(51) Int. Cl.
  *G09G 3/32* (2016.01)
  *H01L 27/15* (2006.01)
  *G09G 3/20* (2006.01)

(52) U.S. Cl.
  CPC ............. *G09G 3/32* (2013.01); *G09G 3/2003* (2013.01); *H01L 27/156* (2013.01); *G09G 2300/0426* (2013.01); *G09G 2300/0452* (2013.01)

(58) Field of Classification Search
  CPC .. G09G 3/3233; G09G 3/3607; G09G 3/3648; H01L 27/3216
  See application file for complete search history.

(56) References Cited

U.S. PATENT DOCUMENTS

| 7,880,698 | B2 | 2/2011 | Park et al. | |
| 8,803,417 | B2* | 8/2014 | Chaji | H01L 51/50 |
| | | | | 313/503 |
| 9,262,957 | B2* | 2/2016 | Yang | G09G 3/2003 |
| 9,858,847 | B2* | 1/2018 | Matsueda | G09G 3/3233 |
| 10,339,845 | B2* | 7/2019 | Choi | G09G 3/3225 |
| 2008/0238817 | A1* | 10/2008 | Mamba | G09G 3/3648 |
| | | | | 345/55 |

(Continued)

FOREIGN PATENT DOCUMENTS

TW    M553816    1/2018

*Primary Examiner* — Sepehr Azari
(74) *Attorney, Agent, or Firm* — JCIPRNET

(57) ABSTRACT

A light emitting diode (LED) display apparatus includes first to third data lines, gate lines, a first color sub-pixel unit and second color sub-pixel units. The gate lines include $(N-1)^{th}$, $N^{th}$ and $(N+1)^{th}$ gate lines. The first color sub-pixel unit includes a first color LED electrically coupled to the first data line and the $(N-1)^{th}$ and $N^{th}$ gate lines. When the $(N-1)^{th}$ or $N^{th}$ gate line is enabled, the first color LED is turned on. The second color sub-pixel unit is electrically connected to the second data line, and includes a second color LED. The second color sub-pixel units are electrically coupled to the gate lines, respectively. When each gate line is enabled, the corresponding second color LED is turned on. A light emitting area of the first color sub-pixel unit is greater than a light emitting area of each second color sub-pixel unit.

8 Claims, 7 Drawing Sheets

(56) References Cited

U.S. PATENT DOCUMENTS

| | | | |
|---|---|---|---|
| 2012/0268357 A1* | 10/2012 | Shih | G09G 3/3607 |
| | | | 345/88 |
| 2013/0009930 A1* | 1/2013 | Cho | G09G 3/2003 |
| | | | 345/211 |
| 2015/0235587 A1* | 8/2015 | Su | G09G 3/2003 |
| | | | 345/694 |
| 2015/0270317 A1* | 9/2015 | Lee | H01L 27/3218 |
| | | | 257/40 |
| 2016/0284290 A1* | 9/2016 | Tamaki | G09G 3/3614 |
| 2017/0116900 A1* | 4/2017 | Chaji | G09G 3/2003 |
| 2017/0309688 A1* | 10/2017 | Lee | G09G 3/2003 |
| 2019/0056609 A1* | 2/2019 | Kim | G02F 1/136286 |
| 2019/0066598 A1* | 2/2019 | Kim | G09G 3/3266 |

* cited by examiner

LIGHT EMITTING DIODE DISPLAY APPARATUS

CROSS REFERENCE TO RELATED APPLICATION

This application claims the priority benefit of Taiwan application serial no. 108106493, filed on Feb. 26, 2019. The entirety of the above-mentioned patent application is hereby incorporated by reference herein and made a part of specification.

BACKGROUND

Technical Field

The invention relates to a display apparatus, and particularly relates to a light emitting diode (LED) display apparatus.

Description of Related Art

Light emitting diode (LED) has advantages of high energy conversion efficiency, short reaction time, long lifetime, etc., and thus has become a main illumination source with both power saving and environmental protection features in recent years. Moreover, due to a breakthrough in LED scaling, an LED display technology of directly imprinting the LEDs into pixel structures has gradually appeared in the market.

However, it is difficult to accurately imprint a large quantity of the LEDs into a plurality of pixel structures. Moreover, in the LED display, a pixel driving current has to be higher than a threshold value in order to turn on the LED. Once the LED is turned on, a brightness of the LED display in illuminating state is higher than a brightness of a current liquid crystal display. If a driving method of the liquid crystal display is adopted to continuously provide the driving current to the pixels of the LED display during an enabling period corresponding to each gate line, the LED display may have problems of excessively high brightness and high power consumption.

SUMMARY

The invention is directed to a light emitting diode (LED) display apparatus, in which an amount of LEDs is reduced without compromising resolution of the LED display apparatus.

An embodiment of the invention provides a LED display apparatus including a first data line, a second data line, a third data line, a plurality of gate lines, a first color sub-pixel unit and a plurality of second color sub-pixel units. The first data line is configured to receive a first color data signal. The second data line is configured to receive a second color data signal. The third data line is configured to receive a third color data signal. The first data line, the second data line and the third data line are arranged along a first direction. The gate lines are arranged along a second direction, and include an $(N-1)^{th}$ gate line, an $N^{th}$ gate line and an $(N+1)^{th}$ gate line. The first color sub-pixel unit includes a first color LED electrically coupled to the first data line, the $(N-1)^{th}$ gate line and the $N^{th}$ gate line, and when any one of the $(N-1)^{th}$ gate line and the $N^{th}$ gate line is enabled, the first color LED is turned on. The second color sub-pixel units are electrically connected to the second data line, and respectively include a second color LED. The second color sub-pixel units are respectively and electrically coupled to a plurality of the gate lines, and when each of the gate lines is enabled, the corresponding second color LED is turned on. A light emitting area of the first color sub-pixel unit is larger than a light emitting area of each of the second color sub-pixel units.

In some embodiments, the first data line, the second data line and the third data lines are sequentially arranged along the first direction.

In some embodiments, the first color sub-pixel unit includes a first transistor, a second transistor and a driving transistor respectively having a first terminal, a second terminal and a control terminal. The second terminal of the driving transistor is electrically coupled to the first color LED. The first terminal of the first transistor and the first terminal of the second transistor are electrically coupled to the first data line. The control terminal of the first transistor is electrically coupled to the $(N-1)^{th}$ gate line. The control terminal of the second transistor is electrically coupled to the $N^{th}$ gate line. The first transistor and the second transistor are not turned on at the same time.

In some embodiments, the second color sub-pixel units are electrically coupled to the $(N-1)^{th}$ gate line, the $N^{th}$ gate line and the $(N+1)^{th}$ gate line, respectively. Each of the second color sub-pixel units includes a transistor and a driving transistor. The transistor and the driving transistor respectively have a first terminal, a second terminal and a control terminal. The first terminals of the transistors of the second color sub-pixel units are connected to the second data line. The control terminals of the transistors are electrically coupled to the $(N-1)^{th}$ gate line, the $N^{th}$ gate line and the $(N+1)^{th}$ gate line, respectively, and the second color sub-pixel units are not turned on at the same time.

In some embodiments, the LED display apparatus further includes a third color sub-pixel unit. The third color sub-pixel unit includes a third color LED electrically connected to the third data line, the $N^{th}$ gate line and the $(N+1)^{th}$ gate line. When any one of the $N^{th}$ gate line and the $(N+1)^{th}$ gate line is enabled, the third color LED is turned on. A light emitting area of the third color sub-pixel unit is greater than a light emitting area of the second color sub-pixel unit.

In some embodiments, the third color sub-pixel unit includes a first transistor, a second transistor and a driving transistor respectively having a first terminal, a second terminal and a control terminal. The second terminal of the driving transistor is electrically coupled to the third color LED. The first terminal of the first transistor and the first terminal of the second transistor are electrically coupled to the third data line. The control terminal of the first transistor is electrically coupled to the $N^{th}$ gate line. The control terminal of the second transistor is electrically coupled to the $(N+1)^{th}$ gate line. The first transistor and the second transistor are not turned on at the same time.

In some embodiments, the first color LED, the second color LED and the third color LED are respectively a micro LED. The first color sub-pixel unit, each of the second color sub-pixel units and the third color sub-pixel unit are respectively a sub-pixel driving circuit including the micro LED.

In some embodiments, dimensions of the first color LED of the first color sub-pixel unit is greater than dimensions of the second color LED of each of the second color sub-pixel units.

According to the above description, in the LED display apparatus according to embodiments of the invention, some sub-pixel units are shared by different enabling periods corresponding to the different gate lines, thus an amount of the sub-pixel units can be reduced. In this way, an amount of the LEDs can be reduced, so as to alleviate the difficulty of imprinting the LEDs, and reduce a manufacturing cost of the LED display apparatus. Moreover, although some of the pixel units can share the same sub-pixel unit (for example, the first color sub-pixel unit) during consecutive enabling periods, distribution regions of these pixel units having the common sub-pixel unit are not completely overlapped. Therefore, these pixel units sharing the same sub-pixel unit can still be recognized as distinct pixel units by an observer. In other words, an amount of the sub-pixel units (also an amount of the LEDs) in the LED display apparatus may be reduced without compromising a resolution of the LED display. Moreover, those sub-pixel units shared in different enabling periods has a larger light emitting area, and may further accommodate a circuit that was disposed in a border region (not shown) of the LED display apparatus. Therefore, a border width of the LED display apparatus may be reduced, and a narrow border LED display apparatus or a borderless LED display apparatus may be attained.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
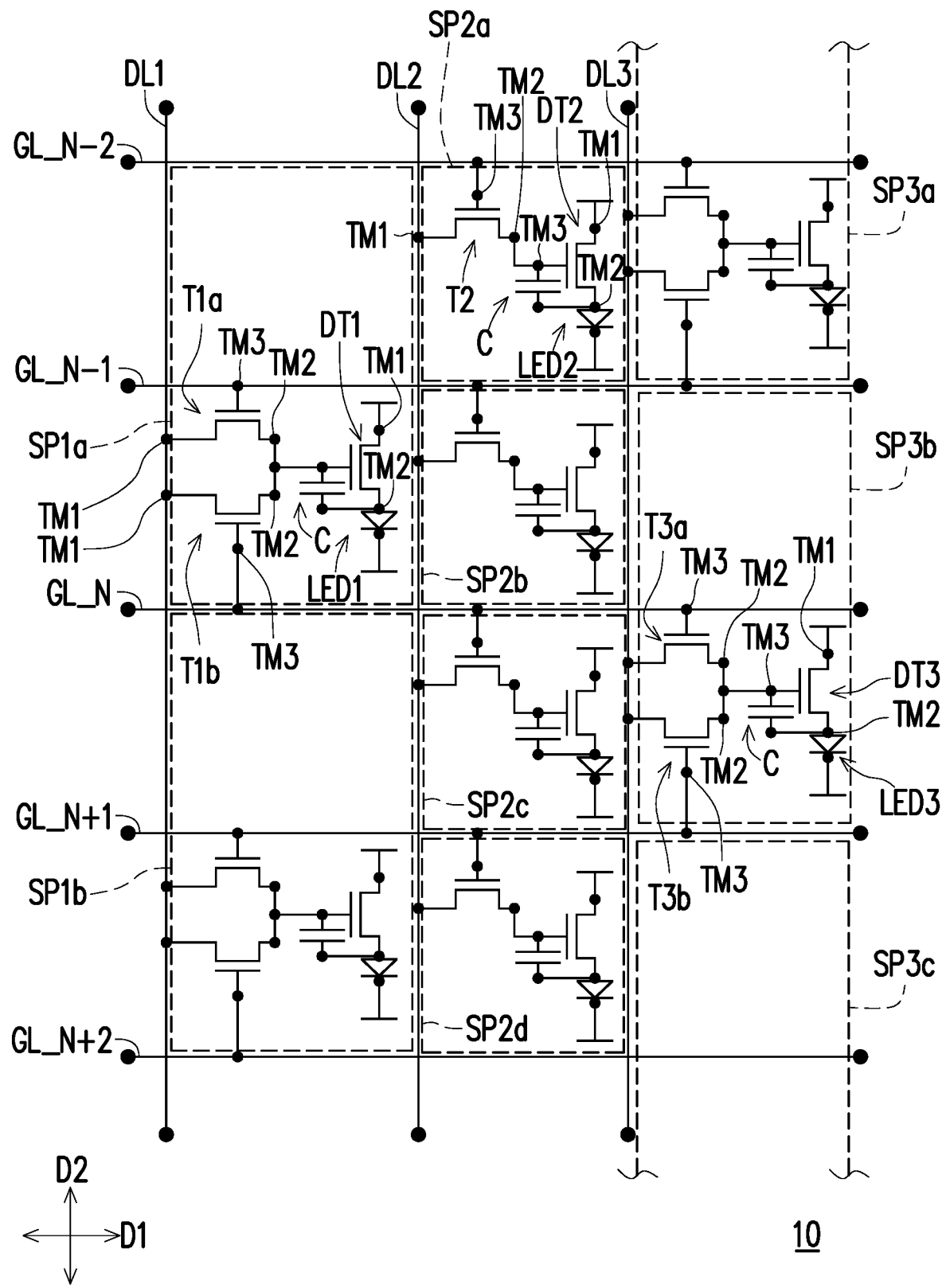
FIG. 1A is a schematic diagram of an LED display apparatus according to an embodiment of the invention.

FIG. 1A is a schematic diagram of an LED display apparatus 10 according to an embodiment of the invention.

Referring to FIG. 1A, the LED display apparatus 10 of some embodiments of the invention includes a plurality of data lines and a plurality of gate lines. The data lines and the gate lines are intersected with each other. Moreover, the data lines and the gate lines may be formed on an array substrate (not shown). For example, the data lines include a first data line DL1, a second data line DL2 and a third data line DL3. The first data line DL1, the second data line DL2 and the third data line DL3 are arranged along a first direction D1, and respectively extend along a second direction D2 intersected with the first direction D1. In some embodiments, the first direction D1 may be perpendicular to the second direction D2. On the other hand, the gate lines, for example, include an $N^{th}$ gate line GL_N, an $(N+1)^{th}$ gate line GL_N+1, an $(N+2)^{th}$ gate line GL_N+2, an $(N-1)^{th}$ gate line GL_N-1 and an $(N-2)^{th}$ gate line GL_N-2 arranged along the second direction D2 and respectively extending along the first direction D1.

The LED display apparatus 10 further includes a plurality of first color sub-pixel units and a plurality of second color sub-pixel units, and in some embodiments, further includes a plurality of third color sub-pixel units. Each of the first color sub-pixel units, each of the second color sub-pixel units, and each of the third color sub-pixel units include one or more first color LEDs LED1, one or more second color LEDs LED2, and one or more third color LEDs LED3, respectively. In addition, the first color sub-pixel unit, the second color sub-pixel unit and the third color sub-pixel unit have main wavelength ranges different from each other. In some embodiments, the first color LED LED1, the second color LED LED2, and the third color LED LED3 may be respectively an LED or a micro LED. In some embodiments, the first color LED LED1, the second color LED LED2, and the third color LED LED3 may be respectively a micro crystallite (or referred as micro LED). In these embodiments, the first color sub-pixel units, the second color sub-pixel units and the third color sub-pixel units are respectively sub-pixel driving circuits including the micro LED(s). For example, a dimension (for example, a length, a width or a height) of the LED or the micro LED may range from 1 μm to 1000 μm. In some embodiments, the micro LEDs are imprinted into the plurality of sub-pixel driving circuits by an imprinting process. For simplicity purpose, micro LEDs are taken as examples for describing the LEDs in the following paragraphs.

For example, the plurality of first color sub-pixel units may include a first color sub-pixel unit SP1$a$ and a first color sub-pixel unit SP1$b$. Each of the first color sub-pixel units includes one or more first color LEDs LED1. In some embodiments, the first color LED LED1 emits red light. For example, a main wavelength range of the first color LED LED1 may be from 610 nm to 670 nm. Each of the first color sub-pixel units is electrically coupled to the first data line DL1 and two adjacent gate lines. Taking the first color sub-pixel unit SP1$a$ as an example, the first color sub-pixel unit SP1$a$ is electrically coupled to the first data line DL1, the $(N-1)^{th}$ gate line GL_N-1 and the $N^{th}$ gate line GL_N. When any one of the $(N-1)^{th}$ gate line GL_N-1 and the $N^{th}$ gate line GL_N is enabled, the first color LED LED1 in the first color sub-pixel unit SP1$a$ is turned on. Similarly, the first color sub-pixel unit SP1$b$ is electrically coupled to the first data line DL1, the $(N+1)^{th}$ gate line GL_N+1 and the $(N+2)^{th}$ gate line GL_N+2. In other words, when any one of the $(N+1)^{th}$ gate line GL_N+1 and the $(N+2)^{th}$ gate line GL_N+2 is enabled, the first color LED LED1 in the first color sub-pixel unit SP1$b$ is turned on. On the other hand, the first data line DL1 may receive a first color data signal to adjust a driving current of the first color LEDs LED1 in the first color sub-pixel units, so as to control a brightness of the first color LEDs LED1.

In some embodiments, each of the first color sub-pixel units (for example, the first color sub-pixel unit SP1$a$) includes a first transistor T1$a$, a second transistor T1$b$ and a driving transistor DT1. The first transistor T1$a$, the second transistor T1$b$ and the driving transistor DT1 respectively have a first terminal TM1, a second terminal TM2 and a control terminal TM3. In some embodiments, the first terminal TM1, the second terminal TM2 and the control terminal TM3 are respectively a source, a drain and a gate of a transistor (including the first transistor T1$a$, the second transistor T1$b$ and the driving transistor DT1). The second terminal TM2 of the driving transistor DT1 is electrically coupled to the first color LED LED1, and the first terminal TM1 of the driving transistor DT1 is connected to a reference voltage. The second terminals TM2 of the first transistor T1$a$ and the second transistor T1$b$ are both electrically coupled to the control terminal TM3 of the driving transistor DT1. Moreover, the first terminals TM1 of the first transistor T1a and the second transistor T1b are both electrically coupled to the first data line DL1. On the other hand, the control terminals TM3 of the first transistor T1a and the second transistor T1b are electrically coupled to different gate lines. Taking the first color sub-pixel unit SP1a as an example, the control terminal TM3 of the first transistor T1a is electrically coupled to the $(N-1)^{th}$ gate line GL_N-1, and the control terminal TM3 of the second transistor T1b is electrically coupled to the $N^{th}$ gate line GL_N.

In some embodiments, each of the first color sub-pixel units (for example, the first color sub-pixel unit SP1a) further includes a capacitor C. One end of the capacitor C is electrically connected between the control terminal TM3 of the driving transistor DT1 and the second terminal TM2 of the first transistor T1a (or the second transistor T1b), and the other end of the capacitor C is electrically connected to the first color LED LED1. In some embodiments, the driving transistor DT1 may be further electrically coupled to a compensation circuit (not shown), so as to adjust the driving current of the first color LED LED1.

In some embodiments, adjacent gate lines are enabled in consecutive periods. In this way, the first transistor T1a and the second transistor T1b are turned on in two consecutive periods. Nevertheless, the first transistor T1a and the second transistor T1b respectively conducted in two consecutive periods can both turn on the driving transistor DT1, so as to turn on the first color LED LED1. In other words, the first color sub-pixel unit can emit light in two consecutive enabling periods, which may be regarded as a single sub-pixel unit shared by the two consecutive enabling periods. For example, the first color sub-pixel unit SP1a is shared by the enabling periods corresponding to the $(N-1)^{th}$ gate line GL_N-1 and the $N^{th}$ gate line GL_N, and the first color sub-pixel unit SP1b is shared by the enabling periods corresponding to the $(N+1)^{th}$ gate line GL_N+1 and the $(N+2)^{th}$ gate line GL_N+2. On this basis, one first color sub-pixel unit is shared by the enabling periods corresponding to two adjacent gate lines. In this way, an equivalent distribution region (i.e. a light emitting area described below) of the first color sub-pixel unit SP1a may span along the second direction D2 between the $N^{th}$ gate line GL_N and the $(N-1)^{th}$ gate line GL_N-1, and between the $(N-1)^{th}$ gate line GL_N-1 and the $(N-2)^{th}$ gate line GL_N-2. In addition, an equivalent distribution region of the first color sub-pixel unit SP1b may span along the second direction D2 between the $(N+2)^{th}$ gate line GL_N+2 and the $(N+1)^{th}$ gate line GL_N+1, and between the $(N+1)^{th}$ gate line GL_N+1 and the $N^{th}$ gate line GL_N. In other words, the equivalent distribution region of each of the first color sub-pixel units spans along the second direction D2 among three adjacent gate lines. On the other hand, each of the first color sub-pixel units spans along the first direction D1 between two adjacent data lines.

The plurality of second color sub-pixel units, for example, include a second color sup-pixel unit SP2a, a second color sup-pixel unit SP2b, a second color sup-pixel unit SP2c and a second color sup-pixel unit SP2d. Each of the second color sub-pixel units includes one or more second color LEDs LED2. In some embodiments, the second color LED LED2 emits green light. For example, a main wavelength range of the second color LED LED2 may be from 510 nm to 560 nm. The second color sub-pixel units are electrically connected to the second data line DL2, and electrically coupled to a plurality of gate lines, respectively. Taking the second color sub-pixel unit SP2b as an example, the second color sub-pixel unit SP2b is electrically connected to the second data line DL2, and electrically coupled to the $(N-1)^{th}$ gate line GL_N-1. When the $(N-1)^{th}$ gate line GL_N-1 is enabled, the second color LED LED2 in the second color sub-pixel unit SP2b is turned on. On the other hand, the second data line DL2 may be configured to receive a second color data signal used for adjusting a brightness of the second color LED LED2.

In some embodiments, each of the second color sub-pixel units includes a transistor T2 and a driving transistor DT2. The transistor T2 and the driving transistor DT2 respectively have a first terminal TM1, a second terminal TM2 and a control terminal TM3. In some embodiments, the first terminal TM1, the second terminal TM2 and the control terminal TM3 are respectively a source, a drain and a gate of a transistor (including the transistor T2 and the driving transistor DT2). The second terminal TM2 of the driving transistor DT2 is electrically coupled to the second color LED LED2, and the first terminal TM1 of the driving transistor DT2 is connected to the reference voltage. The second terminal TM2 of the transistor T2 is electrically coupled to the control terminal TM3 of the driving transistor DT2. Moreover, the first terminal TM1 of the transistor T2 is electrically coupled to the second data line DL2. On the other hand, the control terminals TM3 of the transistors T2 of a plurality of the second color sub-pixel units are electrically coupled to different gate lines. For example, the control terminal TM3 of the transistor T2 of the second color sub-pixel unit SP2b is electrically coupled to the $(N-1)^{th}$ gate line GL_N-1, and the control terminal TM3 of the transistor T2 of the second color sub-pixel unit SP2c is electrically coupled to the $(N+1)^{th}$ gate line GL_N+1.

In some embodiments, similar to the first color sub-pixel unit, each of the second color sub-pixel units (for example, the second color sub-pixel unit SP2b) further includes a capacitor C. One end of the capacitor C is electrically connected between the control terminal TM3 of the driving transistor DT2 and the second terminal TM2 of the transistor T2, and the other end of the capacitor C is electrically connected to the second color LED LED2. In some embodiments, the driving transistor DT2 may further be electrically coupled to a compensation circuit (not shown), so as to adjust the driving current of the second color LED LED2.

In some embodiments, different gate lines are enabled in different periods. In this way, the second color LEDs LED2 in different second color sub-pixel units are turned on in different periods, such that the different second color sub-pixel units emit light in different enabling periods. In other words, none of the second color sub-pixel units is shared by different enabling periods corresponding to different gate lines. In this way, a distribution region of each of the second color sub-pixel units may span along the second direction D2 between two adjacent gate lines. For example, a distribution region of the second color sub-pixel unit SP2b may span along the second direction D2 between the $N^{th}$ gate line GL_N and the $(N-1)^{th}$ gate line GL_N-1. On the other hand, each of the second color sub-pixel units may span along the first direction D1 between two adjacent data lines. In these embodiments, a light emitting area (i.e. the aforementioned distribution region) of the first color sub-pixel unit is greater than a light emitting area of the second color sub-pixel unit. For example, a ratio of the light emitting area of the first color sub-pixel unit with respect to the light emitting area of the second color sub-pixel unit may be greater than or equal to 2. Regarding the difference of the light emitting areas, dimensions of the first color LED LED1 in the first color sub-pixel unit may be greater than dimensions of the second color LED LED2 in the second color sub-pixel unit. In some embodiments, a dimension (for example, a length, a width or a height) of the first color LED LED1 in the first color sub-pixel unit may range from 0.1 μm to 1000 μm, and a dimension of the second color LED LED2 in the second color sub-pixel unit may range from 0.1 μm to 1000 μm.

The plurality of third color sub-pixel units, for example, include a third color sup-pixel unit SP3a, a third color sup-pixel unit SP3b and a third color sup-pixel unit SP3c arranged along the second direction D2. Each of the third color sub-pixel units includes one or more third color LEDs LED3. In some embodiments, the third color LED LED3 emits blue light. For example, a main wavelength range of the third color LED LED3 may be from 254 nm to 470 nm. Each of the third color sub-pixel units is electrically coupled to the third data line DL3 and two adjacent gate lines. Taking the third color sub-pixel unit SP3b as an example, the third color sub-pixel unit SP3b is electrically coupled to the third data line DL3, the $N^{th}$ gate line GL_N and the $(N+1)^{th}$ gate line GL_N+1. In other words, when any one of the $N^{th}$ gate line GL_N and the $(N+1)^{th}$ gate line GL_N+1 is enabled, the third color LED LED3 in the third color sub-pixel unit SP3b can be turned on. On the other hand, the third data line DL3 may receive a third color data signal used for adjusting a driving current of the third color LED LED3.

In some embodiments, each of the third color sub-pixel units (for example, the third color sub-pixel unit SP3b) includes a first transistor T3a, a second transistor T3b and a driving transistor DT3. The first transistor T3a, the second transistor T3b and the driving transistor DT3 respectively have a first terminal TM1, a second terminal TM2 and a control terminal TM3. In some embodiments, the first terminal TM1, the second terminal TM2 and the control terminal TM3 are respectively a source, a drain and a gate of a transistor (including the first transistor T3a, the second transistor T3b and the driving transistor DT3). The second terminal TM2 of the driving transistor DT3 is electrically coupled to the third color LED LED3, and the first terminal TM1 of the driving transistor DT3 is connected to the reference voltage. The second terminals TM2 of the first transistor T3a and the second transistor T3b are both electrically coupled to the control terminal TM3 of the driving transistor DT3. Moreover, the first terminals TM1 of the first transistor T3a and the second transistor T3b are both electrically coupled to the third data line DL3. On the other hand, the control terminals TM3 of the first transistor T3a and the second transistor T3b are electrically coupled to different gate lines. Taking the third color sub-pixel unit SP3b as an example, the control terminal TM3 of the first transistor T3a is electrically coupled to the $N^{th}$ gate line GL_N, and the control terminal TM3 of the second transistor T3b is electrically coupled to the $(N+1)^{th}$ gate line GL_N+1.

In some embodiments, each of the third color sub-pixel units (for example, the third color sub-pixel unit SP3b) further includes a capacitor C. One end of the capacitor C is electrically connected between the control terminal TM3 of the driving transistor DT3 and the second terminal TM2 of the first transistor T3a (or the second transistor T3b), and the other end of the capacitor C is electrically connected to the third color LED LED3. In some embodiments, the driving transistor DT3 may be further electrically coupled to a compensation circuit (not shown), so as to adjust the driving current of the third color LED LED3.

In some embodiments, the adjacent gate lines are enabled in consecutive periods. In this way, the first transistor T3a and the second transistor T3b are turned on in two consecutive periods. Nevertheless, the first transistor T3a and the second transistor T3b respectively conducted in two consecutive periods can both turn on the driving transistor DT3, so as to turn on the third color LED LED3. In other words, the third color sub-pixel unit may emit light in both two consecutive enabling periods, and may be regarded as a sub-pixel unit shared by the enabling periods of the two adjacent gate lines. In some embodiments, similar to the first color sub-pixel unit, an equivalent distribution region (i.e. a light emitting area) of each of the third color sub-pixel units span along the second direction D2 among three adjacent gate lines. On the other hand, a distribution region of each of the third color sub-pixel units span along the first direction D1 between two adjacent data lines. In these embodiments, a light emitting area of the third color sub-pixel unit is greater than the light emitting area of the second color sub-pixel unit. For example, a ratio of the light emitting area of the third color sub-pixel unit with respect to the light emitting area of the second color sub-pixel unit may be greater than or equal to 2. Regarding the difference of the light emitting areas, dimensions of the third color LED LED3 in the third color sub-pixel unit may be greater than the dimensions of the second color LED LED2 in the second color sub-pixel unit. In some embodiments, a dimension (for example, a length, a width or a height) of the third color LED LED3 in the third color sub-pixel unit may range from 0.1 μm to 1000 μm, and a dimension of the second color LED LED2 in the second color sub-pixel unit may range from 0.1 μm to 1000 μm.

In some embodiments, the first color sub-pixel unit, the second color sub-pixel unit and the third color sub-pixel unit located adjacent to one another along the first direction D1 constitute a single pixel unit. In other embodiments, the pixel unit may also include four or more different sub-pixel units. Moreover, in some embodiments, in each pixel unit, the first color sub-pixel unit is misaligned with respect to the third color sub-pixel unit along the second direction D2. For example, the first color sub-pixel unit SP1b spans from the $N^{th}$ gate line GL_N to the $(N+2)^{th}$ gate line GL_N+2 along the second direction D2, whereas the third color sub-pixel unit SP3b spans from the $(N-1)^{th}$ gate line GL_N−1 to the $(N+1)^{th}$ gate line GL_N+1 along the second direction D2. In other words, an misalignment distance of the first color sub-pixel unit SP1b and the third color sub-pixel unit SP3b along the second direction D2 is a spacing between two adjacent gate lines (for example, a spacing between the $(N-1)^{th}$ gate line GL_N−1 and the $N^{th}$ gate line GL_N).

Figure 1B:
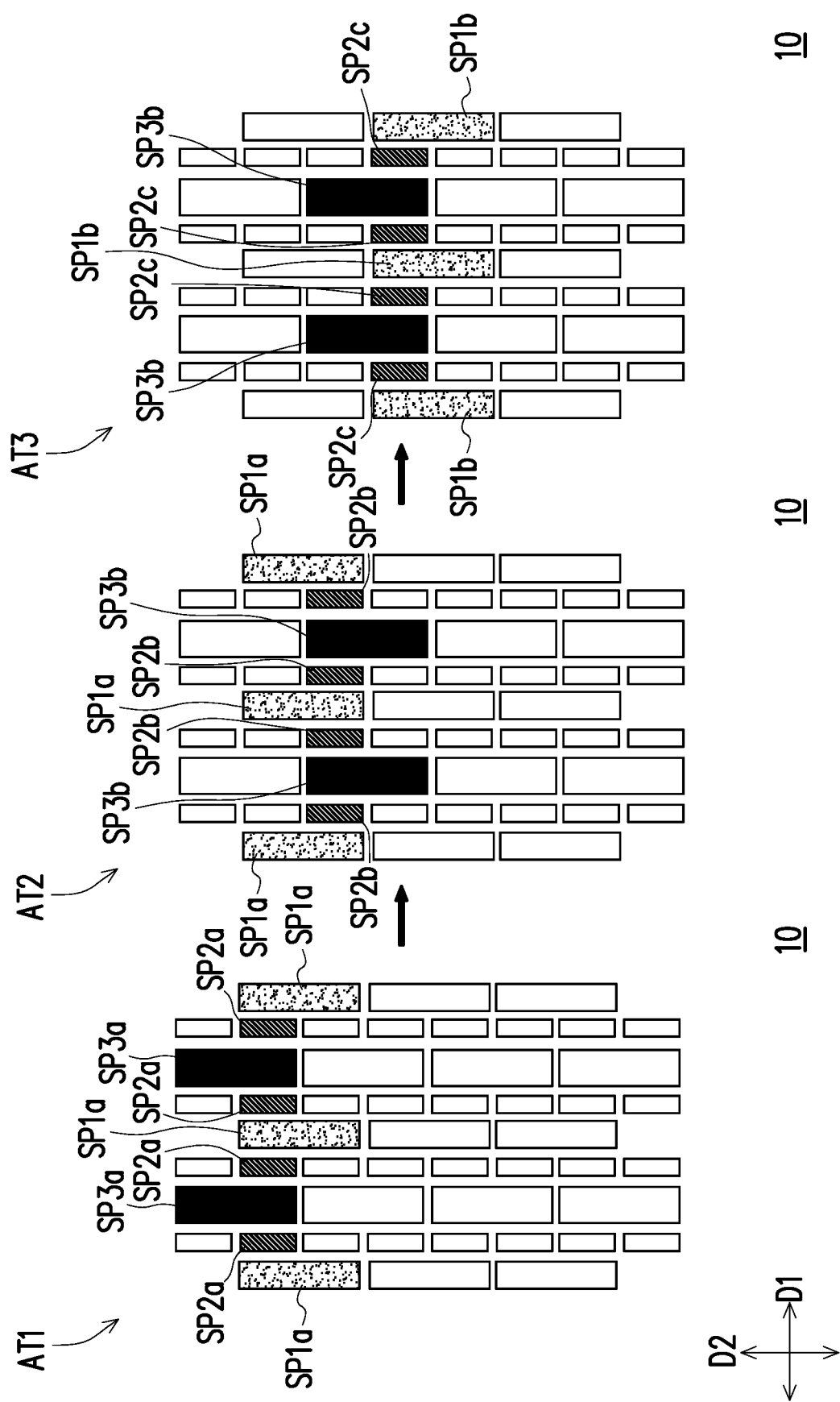
FIG. 1B is a schematic diagram of the LED display apparatus of FIG. 1A in multiple enabling periods corresponding to different gate lines.

FIG. 1B is a schematic diagram of the LED display apparatus 10 of FIG. 1A in the enabling periods corresponding to different gate lines. For simplicity's sake, each of the sub-pixel units is schematically illustrated as a block in FIG. 1B, and the components in each of the sub-pixel units are omitted. Moreover, a solid block represents an illuminating sub-pixel unit, and a blank block represents a sub-pixel unit in a dark state.

Referring to FIG. 1A and FIG. 1B, in an enabling period AT1 corresponding to the $(N-1)^{th}$ gate line GL_N−1, the first color sub-pixel unit SP1a, the second color sub-pixel unit SP2a and the third color sub-pixel unit SP3a arranged along the first direction D1 are in illuminating state. In some embodiments, the first color sub-pixel unit SP1a and the third color sub-pixel unit SP3a are respectively shared by the laterally adjacent pixel units. Moreover, in some embodiments, the light emitting area of the third color sub-pixel unit (for example, the third color sub-pixel unit SP3a) is greater than the light emitting area of the first color sub-pixel unit (for example, the third color sub-pixel unit SP1a). For example, a ratio of the light emitting area of the third color sub-pixel unit with respect to the light emitting area of the first color sub-pixel unit may be greater than 1, and smaller or equal to 2.

Thereafter, in an enabling period AT2 corresponding to the $N^{th}$ gate line GL_N, the first color sub-pixel unit SP1a, the second color sub-pixel unit SP2b and the third color sub-pixel unit SP3b arranged along the first direction D1 are in illuminating state. In the enabling period AT1 corresponding to the $(N-1)^{th}$ gate line GL_N-1 and the enabling period AT2 corresponding to the $N^{th}$ gate line GL_N, the first color sub-pixel unit SP1a is kept in illuminating state. In other words, the first color sub-pixel unit SP1a is shared by the enabling period AT1 and the enabling period AT2.

Then, in an enabling period AT3 corresponding to the $(N+1)^{th}$ gate line GL_N+1, the first color sub-pixel unit SP1b, the second color sub-pixel unit SP2c and the third color sub-pixel unit SP3b arranged along the first direction D1 are in illuminating state. In the enabling period AT2 corresponding to the $N^{th}$ gate line GL_N and the enabling period AT3 corresponding to the $(N+1)^{th}$ gate line GL_N+1, the third color sub-pixel unit SP3b is kept in illuminating state. In other words, the third color sub-pixel unit SP3b is shared by the enabling period AT2 and the enabling period AT3.

Based on the above description, in the LED display apparatus 10 according to embodiments of the invention, some sub-pixel units are shared by different enabling periods corresponding to the different gate lines, thus an amount of the sub-pixel units can be reduced. In this way, an amount of the LEDs can be reduced, so as to alleviate the difficulty of imprinting the LEDs, and reduce a manufacturing cost of the LED display apparatus. Moreover, although some of the pixel units can share the same sub-pixel unit (for example, the first color sub-pixel unit) during consecutive enabling periods, distribution regions of these pixel units having the common sub-pixel unit are not completely overlapped. Therefore, these pixel units sharing the same sub-pixel unit can still be recognized as distinct pixel units by an observer. In other words, an amount of the sub-pixel units (also an amount of the LEDs) in the LED display apparatus may be reduced without compromising a resolution of the LED display. Moreover, those sub-pixel units shared by different enabling periods has a larger light emitting area, and may further accommodate a circuit that was disposed in a border region (not shown) of the LED display apparatus 10. Therefore, a border width of the LED display apparatus 10 may be reduced, and a narrow border LED display apparatus or a borderless LED display apparatus may be attained.

Figure 1C:
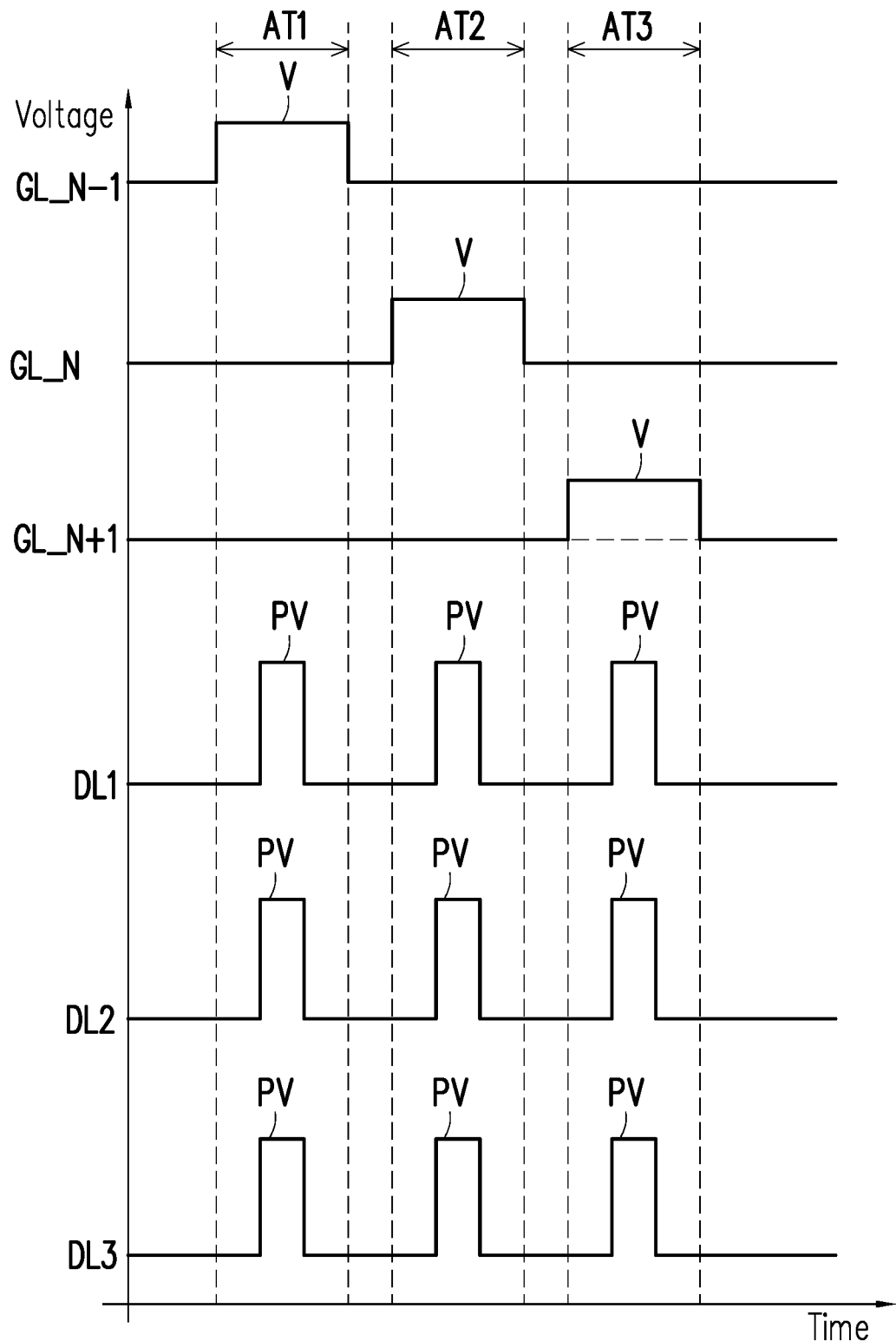
FIG. 1C is a timing diagram of voltages used for driving the LED display apparatus of FIG. 1A.

FIG. 1C is a timing diagram of voltages used for driving the LED display apparatus 10 of FIG. 1A.

Referring to FIG. 1A to FIG. 1C, in the enabling period AT1 corresponding to the $(N-1)^{th}$ gate line GL_N-1, the $(N-1)^{th}$ gate line GL_N-1 receives a constant voltage V. In some embodiments, a voltage value of the constant voltage V may range from -10 volts to 35 volts. An application time of the constant voltage V may be substantially equal to a length of the enabling period AT1. On the other hand, in the enabling period AT1, the first data line DL1, the second data line DL2 and the third data line DL3 respectively receive a data signal, so as to provide driving currents to the first color LED LED1, the second color LED LED2 and the third color LED LED3, respectively. The data signal is a pulse voltage PV. In some embodiments, a peak voltage value of the pulse voltage PV may range from -5 volts to 10 volts. An application time of the pulse voltage PV may range from 0.1 μs to 1 s. Similar to the enabling period AT1, in the enabling period AT2 corresponding to the $N^{th}$ gate line GL_N and the enabling period AT3 corresponding to the $(N+1)^{th}$ gate line GL_N+1, the gate lines also receive the constant voltage V, whereas the data lines receive the pulse voltage PV serving as the data signal.

Compared to the constant voltage V, an application time of the pulse voltage PV is relatively short, and a voltage value of the pulse voltage PV is relatively high. In this way, the first color LED LED1, the second color LED LED2 and the third color LED LED3 emit high brightness light in a short period of time during the enabling period instead of continuously emitting light with low brightness during the entire enabling period. In other words, a light emitting time of the LED may be shortened to reduce the power consumption of the LED display apparatus 10. In these embodiments, the light emitting time of the LEDs is reduced, but the light emitting brightness thereof is increased. Light having the greater brightness may render the longer visual retention time to the observer. In some embodiments, the visual retention time rendered to the observer by the LED may be close to the length of the enabling time AT1. Therefore, the power consumption of the LED display apparatus 10 may be reduced without substantially compromising the display quality.

Figure 2:
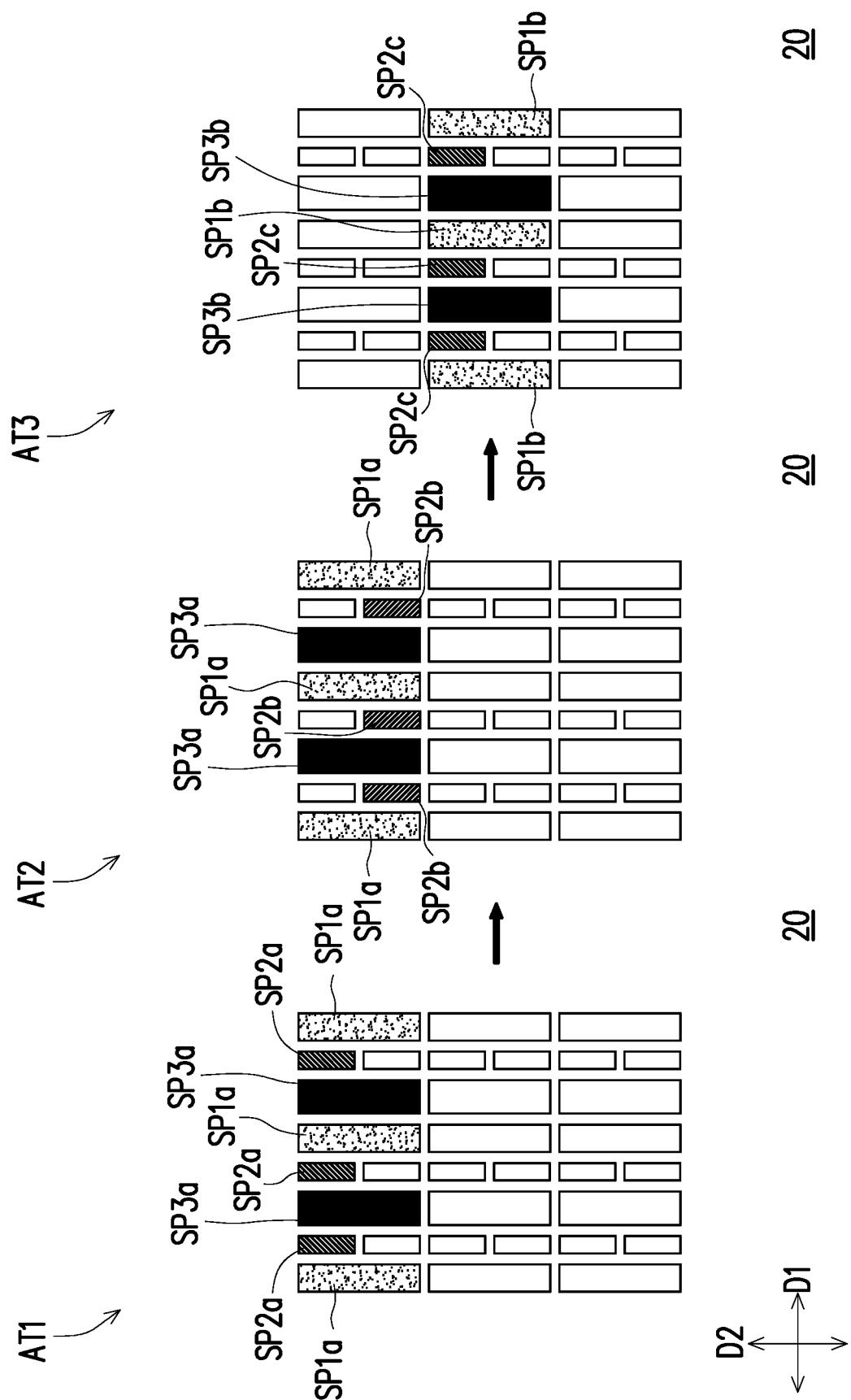
FIG. 2 to FIG. 5 are schematic diagrams of LED display apparatuses in multiple enabling periods corresponding to different gate lines according to other embodiments of the invention.

FIG. 2 is a schematic diagram of an LED display apparatus 20 in the enabling periods corresponding to different gate lines according to some embodiments of the invention. The LED display apparatus 20 of FIG. 2 is similar to the LED display apparatus 10 of FIG. 1B, and differences therebetween are described as follows, whereas the same or similar parts are not repeated.

Referring to FIG. 2, along the first direction D1, the first color sub-pixel unit and the third color sub-pixel unit (for example, the first color sub-pixel unit SP1a and the third color sub-pixel unit SP3a) in the same row are substantially aligned with one another, and a misalignment between the first color sub-pixel unit and the third color sub-pixel unit along the second direction D2 is absent.

In the enabling period AT1 corresponding to the $(N-1)^{th}$ gate line GL_N-1, the first color sub-pixel unit SP1a, the second color sub-pixel unit SP2a and the third color sub-pixel unit SP3a arranged along the first direction D1 are in illuminating state. Then, in the enabling period AT2 corresponding to the $N^{th}$ gate line GL_N, the first color sub-pixel unit SP1a, the second color sub-pixel unit SP2b and the third color sub-pixel unit SP3a arranged along the first direction D1 are in illuminating state. Subsequently, in the enabling period AT3 corresponding to the $(N+1)^{th}$ gate line GL_N+1, the first color sub-pixel unit SP1b, the second color sub-pixel unit SP2c and the third color sub-pixel unit SP3b arranged along the first direction D1 are in illuminating state.

Therefore, the first color sub-pixel unit SP1a and the third color sub-pixel unit SP3a are both in illuminating state during the enabling periods AT1 and At2. In other words, the first color sub-pixel unit SP1a and the third color sub-pixel unit SP3a are shared by the enabling periods AT1 and AT2. On the other hand, none of the sub-pixel units is shared by the enabling periods AT2 and AT3.

Figure 3:
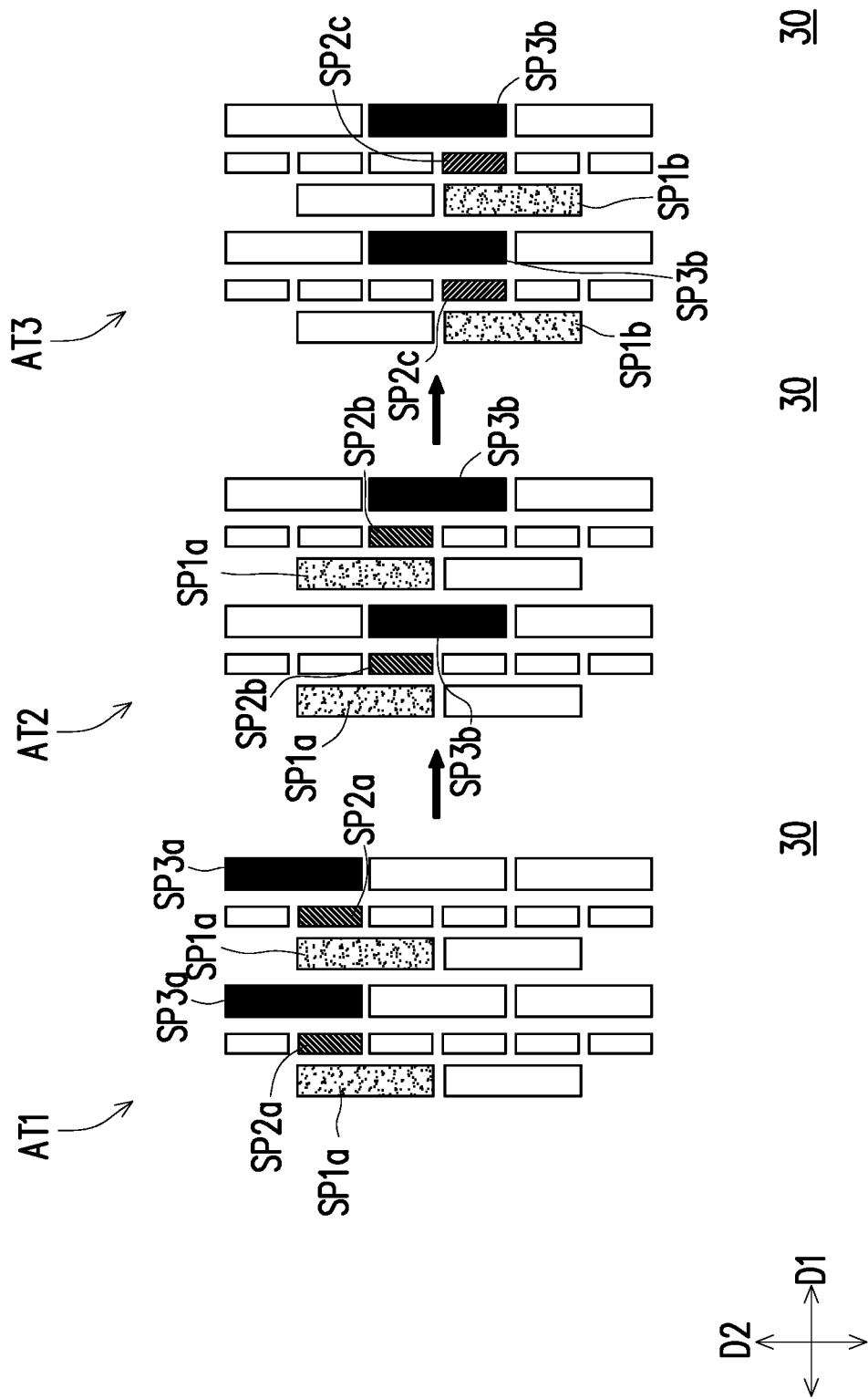

FIG. 3 is a schematic diagram of an LED display apparatus 30 in the enabling periods corresponding to different gate lines according to some embodiments of the invention.

Referring to FIG. 1B and FIG. 3, the LED display apparatus 30 of FIG. 3 is similar to the LED display apparatus 10 of FIG. 1B, except that arrangements of the sub-pixel units along the first direction D1 are different. To be specific, in the LED display apparatus 10 shown in FIG. 1B, each repeating unit of the plurality of sub-pixel units along the first direction D1 includes two pixel units. The two pixel units share the same third color sub-pixel unit (for example, the third color sub-pixel unit SP3a) located at a central region of the repeating unit. On the other hand, in the LED display apparatus 30 shown in FIG. 3, each repeating unit of the plurality of sub-pixel units along the first direction D1 only includes a single pixel unit. In the embodiment of FIG. 3, a ratio of a light emitting area of the third color sub-pixel unit with respect to a light emitting area of the first color sub-pixel unit may be 1 to 4.

Figure 4:
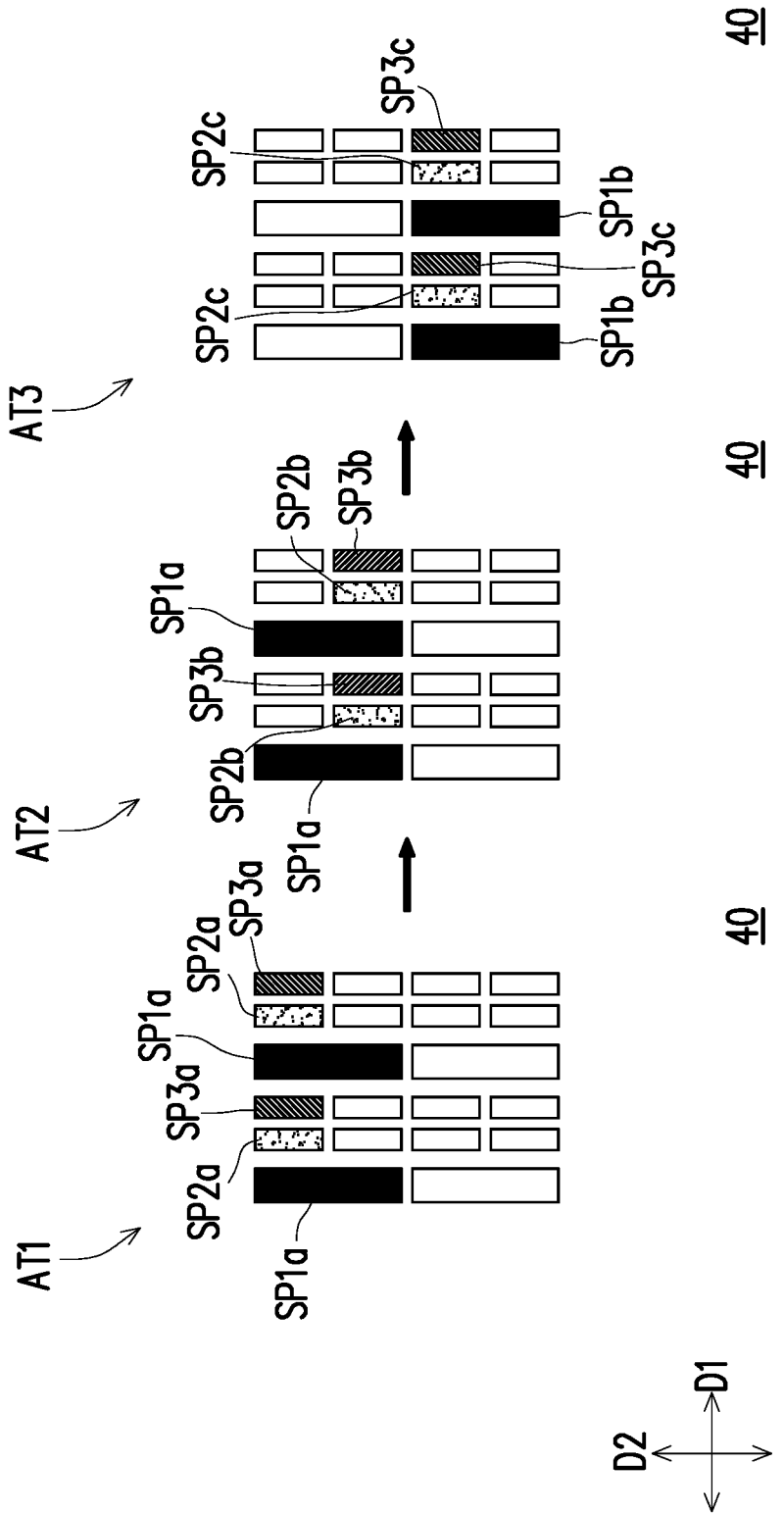

FIG. 4 is a schematic diagram of an LED display apparatus 40 in the enabling periods corresponding to different gate lines according to some embodiments of the invention.

Referring to FIG. 3 and FIG. 4, the LED display apparatus 40 of FIG. 4 is similar to the LED display apparatus 30 of FIG. 3, and only differences therebetween are described as follows, whereas the same or similar parts are not repeated. To be specific, in the LED display apparatus 30 of FIG. 3, the first color sub-pixel unit (for example, the first color sub-pixel unit SP1a), the second color sub-pixel unit (for example, the second color sub-pixel unit SP2a) and the third color sub-pixel unit (for example, the third color sub-pixel unit SP3a) are sequentially arranged along the first direction D1, and respectively emit the red light, the green light and the blue light. Moreover, the third color sub-pixel unit is shared by the two enabling periods (for example, the enabling period AT2 and the enabling period AT3) corresponding to the two adjacent gate lines.

On the other hand, in the LED display apparatus 40 of FIG. 4, the first color sub-pixel unit (for example, the first color sub-pixel unit SP1a) emits the blue light, and the second color sub-pixel unit (for example, the second color sub-pixel unit SP2a) and the third color sub-pixel unit (for example, the third color sub-pixel unit SP3a) respectively emit the red light and the green light. Moreover, the third color sub-pixel unit is not shared by different enabling periods (for example, the enabling period AT2 and the enabling period AT3) corresponding to different gate lines. In the embodiment of FIG. 4, a light emitting area of the third color sub-pixel unit (for example, the third color sub-pixel unit SP3a) is substantially equal to a light emitting area of the second color sub-pixel unit (for example, the second color sub-pixel unit SP2a), and is smaller than a light emitting area of the first color sub-pixel unit (for example, the first color sub-pixel unit SP1a).

Figure 5:
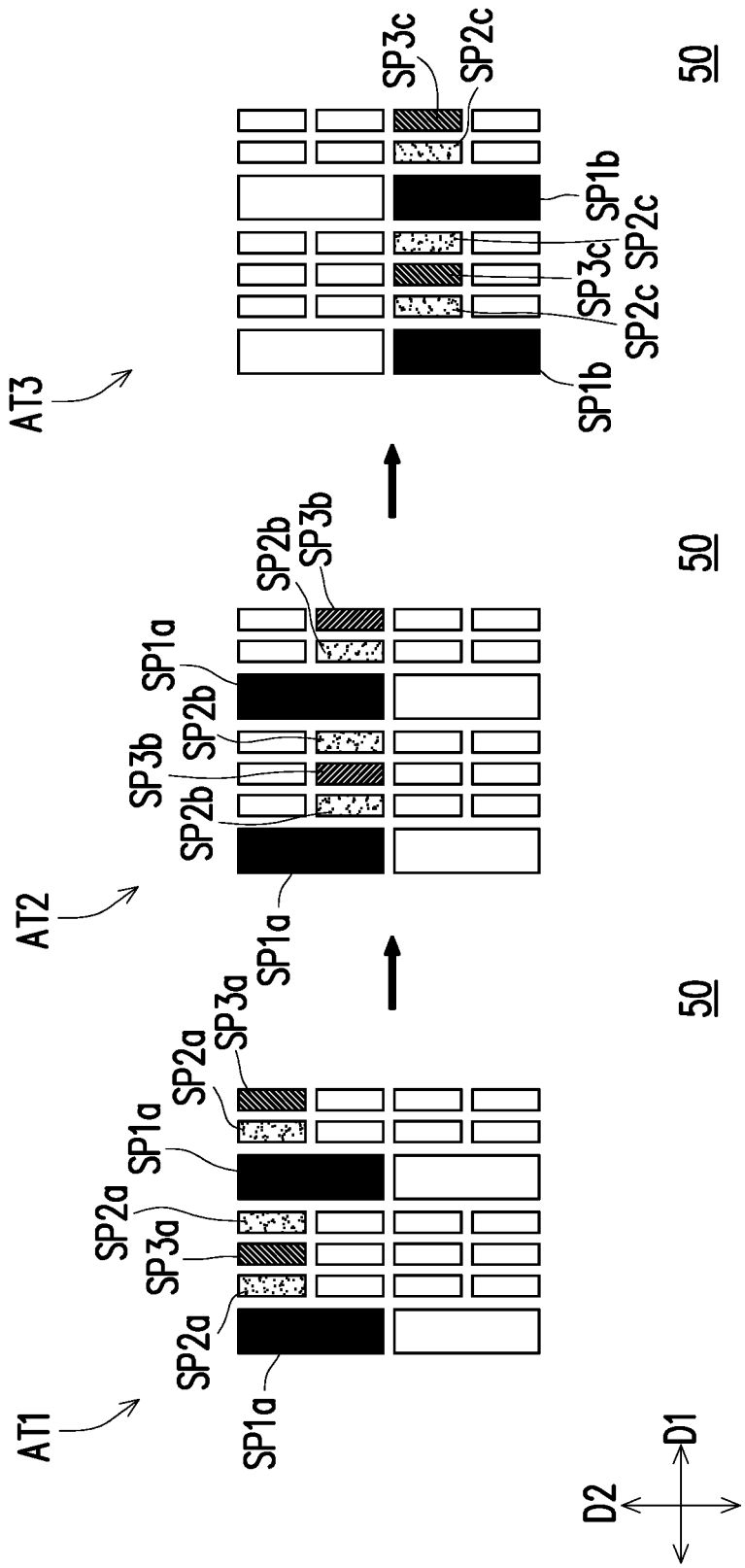

FIG. 5 is a schematic diagram of an LED display apparatus 50 in the enabling periods corresponding to different gate lines according to some embodiments of the invention. The LED display apparatus 50 of FIG. 5 is similar to the LED display apparatus 40 of FIG. 4, and only differences therebetween are described as follows, whereas the same or similar parts are not repeated.

Referring to FIG. 4 and FIG. 5, in the LED display apparatus 40 of FIG. 4, each repeating unit of the plurality of sub-pixel units arranged along the first direction D1 only includes a single pixel unit. On the other hand, in the LED display apparatus 50 of FIG. 5, each repeating unit of the plurality of sub-pixel units arranged along the first direction D1 includes two pixel units. The two pixel units share the same color sub-pixel unit (for example, the third color sub-pixel unit SP3a) located at a central region of the repeating unit. In some embodiments, a light emitting area of the first color sub-pixel unit shown in FIG. 5 is greater than a light emitting area of the first color sub-pixel unit shown in FIG. 4. For example, a ratio of the light emitting area of the first color sub-pixel unit (for example, the first color sub-pixel unit SP1a) shown in FIG. 5 with respect to the light emitting area of the third color sub-pixel unit (for example, the third color sub-pixel unit SP3a) may be substantially greater than 1, and smaller than or equal to 4.

In summary, in the LED display apparatus according to embodiments of the invention, some sub-pixel units are shared by different enabling periods corresponding to the different gate lines, thus an amount of the sub-pixel units can be reduced. In this way, an amount of the LEDs can be reduced, so as to alleviate the difficulty of imprinting the LEDs, and reduce a manufacturing cost of the LED display apparatus. Moreover, although some of the pixel units can share the same sub-pixel unit (for example, the first color sub-pixel unit) during consecutive enabling periods, distribution regions of these pixel units having the common sub-pixel unit are not completely overlapped. Therefore, these pixel units sharing the same sub-pixel unit can still be recognized as distinct pixel units by an observer. In other words, an amount of the sub-pixel units (also an amount of the LEDs) in the LED display apparatus may be reduced without compromising a resolution of the LED display. Moreover, those sub-pixel units shared in different enabling periods has a larger light emitting area, and may further accommodate a circuit that was disposed in a border region (not shown) of the LED display apparatus. Therefore, a border width of the LED display apparatus may be reduced, and a narrow border LED display apparatus or a borderless LED display apparatus may be attained.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. A light emitting diode display apparatus, comprising:
a first data line, configured to receive a first color data signal;
a second data line, configured to receive a second color data signal;
a third data line, configured to receive a third color data signal, wherein the first data line, the second data line and the third data line are arranged along a first direction;
a plurality of gate lines, arranged along a second direction, and comprising an $(N-1)^{th}$ gate line, an $N^{th}$ gate line and an $(N+1)^{th}$ gate line;
a first color sub-pixel unit, comprising a first color light emitting diode electrically coupled to the first data line, the $(N-1)^{th}$ gate line and the $N^{th}$ gate line, wherein when any one of the $(N-1)^{th}$ gate line and the $N^{th}$ gate line is enabled, the first color light emitting diode is turned on; and
a plurality of second color sub-pixel units, electrically connected to the second data line, and respectively comprising a second color light emitting diode, wherein the second color sub-pixel units are respectively and electrically coupled to the gate lines, and when each of the gate lines is enabled, the corresponding second color light emitting diode is turned on,
wherein a light emitting area of the first color sub-pixel unit is larger than a light emitting area of each of the second color sub-pixel units.

2. The light emitting diode display apparatus as claimed in claim 1, wherein the first data line, the second data line and the third data lines are sequentially arranged along the first direction.

3. The light emitting diode display apparatus as claimed in claim 1, wherein the first color sub-pixel unit comprises a first transistor, a second transistor and a driving transistor respectively having a first terminal, a second terminal and a control terminal, the second terminal of the driving transistor is electrically coupled to the first color light emitting diode, the first terminal of the first transistor and the first terminal of the second transistor are electrically coupled to the first data line, the control terminal of the first transistor is electrically coupled to the $(N-1)^{th}$ gate line, the control terminal of the second transistor is electrically coupled to the $N^{th}$ gate line, and the first transistor and the second transistor are not turned on at the same time.

4. The light emitting diode display apparatus as claimed in claim 1, wherein the second color sub-pixel units are electrically coupled to the $(N-1)^{th}$ gate line, the $N^{th}$ gate line and the $(N+1)^{th}$ gate line, respectively, each of the second color sub-pixel units comprises a transistor and a driving transistor, the transistor and the driving transistor respectively have a first terminal, a second terminal and a control terminal, the first terminals of the transistors of the second color sub-pixel units are connected to the second data line, the control terminals of the transistors are electrically coupled to the $(N-1)^{th}$ gate line, the $N^{th}$ gate line and the $(N+1)^{th}$ gate line, respectively, and the second color sub-pixel units are not turned on at the same time.

5. The light emitting diode display apparatus as claimed in claim 1, further comprising:
a third color sub-pixel unit, comprising a third color light emitting diode electrically connected to the third data line, the $N^{th}$ gate line and the $(N+1)^{th}$ gate line, wherein when any one of the $N^{th}$ gate line and the $(N+1)^{th}$ gate line is enabled, the third color light emitting diode is turned on, and a light emitting area of the third color sub-pixel unit is greater than a light emitting area of the second color sub-pixel unit.

6. The light emitting diode display apparatus as claimed in claim 5, wherein the third color sub-pixel unit comprises a first transistor, a second transistor and a driving transistor respectively having a first terminal, a second terminal and a control terminal, the second terminal of the driving transistor is electrically coupled to the third color light emitting diode, the first terminal of the first transistor and the first terminal of the second transistor are electrically coupled to the third data line, the control terminal of the first transistor is electrically coupled to the $N^{th}$ gate line, the control terminal of the second transistor is electrically coupled to the $(N+1)^{th}$ gate line, and the first transistor and the second transistor are not turned on at the same time.

7. The light emitting diode display apparatus as claimed in claim 1, wherein the first color sub-pixel unit, each of the second color sub-pixel units and the third color sub-pixel unit respectively comprise a pixel driving circuit, and the pixel driving circuit is a sub-pixel driving circuit comprising an integrated circuit.

8. The light emitting diode display apparatus as claimed in claim 7, wherein a light emitting area of the first color light emitting diode of the first color sub-pixel unit is greater than a light emitting area of the second color light emitting diode of each of the second color sub-pixel units.

* * * * *